United States Patent
Gandre et al.

[19]

[11] Patent Number: 5,828,549
[45] Date of Patent: *Oct. 27, 1998

[54] COMBINATION HEAT SINK AND AIR DUCT FOR COOLING PROCESSORS WITH A SERIES AIR FLOW

[75] Inventors: Jerry Gandre, Austin; Ty Schmitt, Round Rock, both of Tex.

[73] Assignee: Dell U.S.A., L.P., Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 729,815

[22] Filed: Oct. 8, 1996

[51] Int. Cl.$^6$ ...................................................... H05K 7/20
[52] U.S. Cl. ........................ 361/695; 165/80.3; 165/185; 361/690
[58] Field of Search ................................. 165/80.2, 80.3, 165/80.4, 185; 174/15.1, 16.1, 16.3; 257/706–707, 712–714, 721–722; 361/687–690, 694–699, 703–704, 707, 717–718, 722

[56] References Cited

U.S. PATENT DOCUMENTS

| | | |
|---|---|---|
| 2,815,472 | 12/1957 | Jackson et al. .......................... 361/689 |
| 3,180,404 | 4/1965 | Nelson et al. . |
| 4,277,816 | 7/1981 | Dunn et al. . |
| 4,463,569 | 8/1984 | McLarty . |
| 4,489,363 | 12/1984 | Goldberg . |
| 4,607,685 | 8/1986 | Mitchell, Jr. . |
| 4,675,783 | 6/1987 | Murase et al. . |
| 4,953,634 | 9/1990 | Nelson et al. . |
| 5,002,123 | 3/1991 | Nelson et al. . |
| 5,493,457 | 2/1996 | Kawamura et al. ..................... 361/690 |

FOREIGN PATENT DOCUMENTS

| | | |
|---|---|---|
| 0276606 | 3/1988 | European Pat. Off. . |
| 1215098 | 8/1989 | Japan ..................................... 361/689 |
| 228355 | 1/1990 | Japan . |
| 2168697 | 6/1990 | Japan ..................................... 361/690 |
| 3135098 | 6/1991 | Japan . |
| 521666 | 1/1993 | Japan . |
| 595062 | 4/1993 | Japan . |
| 5259325 | 10/1993 | Japan . |
| 2059569 | 4/1981 | United Kingdom ................... 361/689 |

OTHER PUBLICATIONS

IBM Technical Disclosure Bulletin authored by R.E. Simons, entitled Micro–Modular Air–Cooling Scoop, dated Jun. 1979, pp. 240–241.

*Primary Examiner*—Gregory D. Thompson
*Attorney, Agent, or Firm*—Haynes and Boone, L.L.P.

[57] ABSTRACT

A method and apparatus for dissipating heat from an electrical device and ducting air from one place to another. In a computer having several heat producing devices, one heat sink is thermally attached to each one of the devices. Each of the heat sinks has a base, two side walls and a top wall forming a passage therebetween. The base, side and top walls are all thermally conductive to the corresponding heat producing device, and therefore each of them radiate heat into the passage. Each of the heat sinks also includes several cooling fins that extend into the passage, thereby increasing the thermal efficiency of the heat sink. Furthermore, the passage is of sufficient size to allow multiple heat sinks to be serially lined up, thereby allowing an air mass to flow from one heat sink to another.

14 Claims, 3 Drawing Sheets

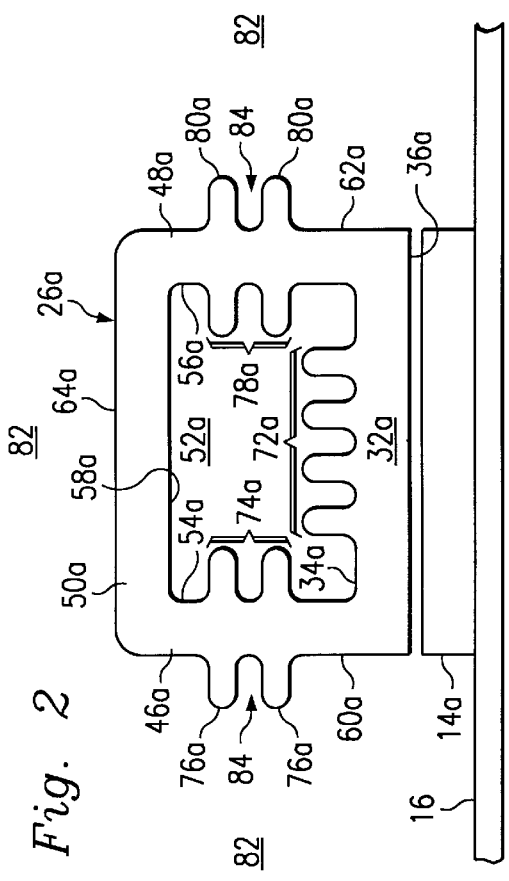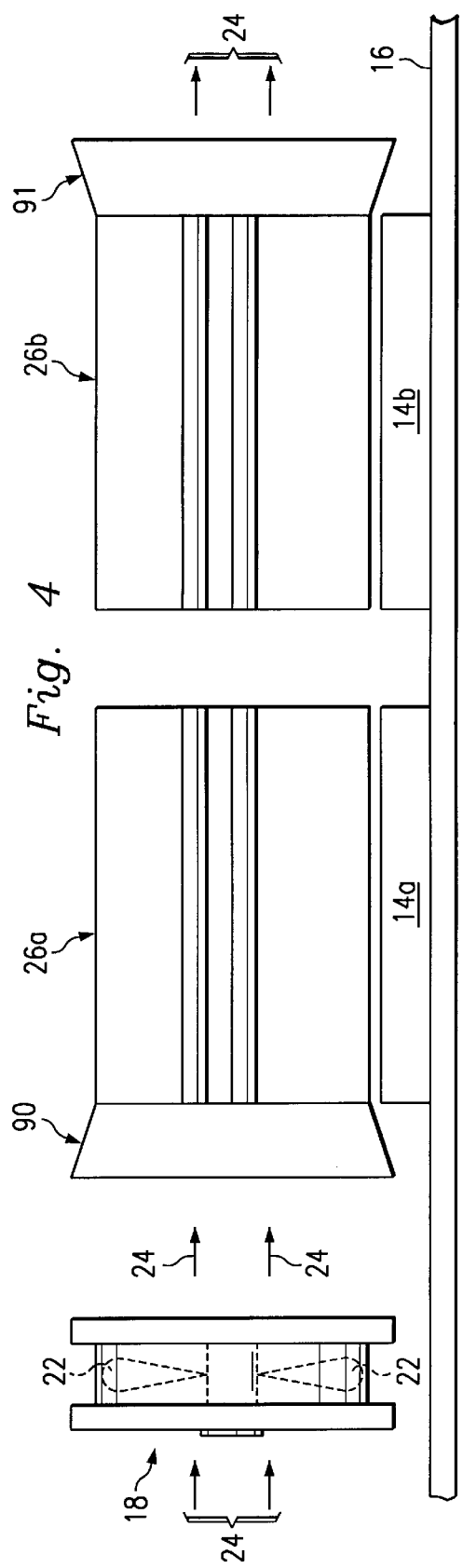

5,828,549

COMBINATION HEAT SINK AND AIR DUCT FOR COOLING PROCESSORS WITH A SERIES AIR FLOW

TECHNICAL FIELD

The invention relates generally to the fields of heat exchange devices and, more particularly, to a combination heat sink and air duct capable of directing an air flow therethrough to facilitate heat exchange.

BACKGROUND OF THE INVENTION

As computer systems grow in speed and shrink in size, power consumed within the computer per unit volume (power density) increases dramatically. Thus, it becomes evermore important to dissipate the heat generated by components within the computer during operation to ensure that the components remain within their normal operating temperature ranges.

The detrimental effects of excessive heat inside a component, such as reduction of the extended life and reliability of the component, are well known in the art. As a result, designers of computers and other electronic circuits have utilized various techniques to remove, or dissipate, heat from the component. One such technique involves heat radiation or convection. An example of convection is a heat sink thermally coupled to the component, combined with a moving air mass. Such heat sinks have a plurality of heat-dissipating projections or fins on a surface thereof (an "upper surface," for purposes of discussion). Another surface of the heat sink (the "lower surface") is placed proximate the component and a retention clip is employed to wrap around the heat sink, gripping a lower surface of the component with inward-facing projections. Heat flows from the component to the heat sink, and as the air mass moves across the surface of the heat sink, heat is transferred to the air mass, where it is carried away from the heat sink and the attached component.

Unfortunately, air is not a particularly good conductor of heat. Therefore, although the air inside a computer has a natural flow rate, most computers still provide fans to force air to move at an increased flow rate over the heat sinks. As a result, the temperature differential between the surface of the component and the surrounding air is increased, thereby improving the efficiency of the heat sink. The increased temperature differential overcomes some of the poor heat-conducting qualities of air.

Of all components in a computer, the central processing unit ("CPU") liberates a large amount of heat during operation of the computer. This springs from its role as the electrical center of attention in the computer. As new generations of CPUs have arrived, however, this relatively simple scheme of forcing air over the heat sink has become decidedly inadequate, risking destruction of the CPU. This is largely due to the fact that air, like electricity, takes the path of least resistance. As a result, air has a tendency to flow over and around the heatsink rather than through the fins or cooling projections of the heatsink, thus, requiring a fan having a higher airflow.

There has been three prevalent remedies to this problem. First of all, the CPU and heat sink can be placed directly in front of the fan, thereby receiving a maximum amount of airflow for the heat exchange. Secondly, shrouds, or air-ducts, have been developed to improve the efficiency of the heatsink. An air-duct works by limiting the area where the air can flow around the heatsink. Conventionally, the air-duct comprises a three-sided, rectangularly shaped shield that is designed to fit over and around the heatsink on three sides, leaving a path through the air-duct for the air to flow through the projections of the heatsink. Thirdly, heat sinks with passages located therein have been developed for receiving the air flow, and concentrating the air flow to certain portions of the heat sink.

However, as more and more components are requiring a high degree of heat exchange, such as in multiple-CPU computer systems, the above three solutions become inadequate for several reasons. Utilizing the first solution described above is inadequate because in order to cool the multiple CPUs, each CPU must be crowded around the fan. Utilizing the second solution is inadequate because several separate heat sinks and air-ducts, one for each component, have to be placed in parallel next to the fan, each receiving a portion of the air flow from the fan. Utilizing the third solution is inadequate because the passages in conventional heat sinks are very shallow, and do not facilitate the flow of air from heat sink to heat sink. Therefore, the three previous solutions typically require more frontal area of air flow, which typically requires an increased number of fans. Furthermore, each of the three previous solutions apportions the air flow to each component, so that no component receives the maximum airflow. Further still, the previous solutions severely restrict the placement of the CPUs inside the computer. In addition, as with all design solutions for modern computers, space constraints, cost, manufacturability and reliability are always important considerations.

SUMMARY OF THE INVENTION

The present invention, accordingly, provides a heat sink having an air duct incorporated therein. In a computer having several heat producing devices, one heat sink of the present invention is thermally attached to each one of the devices. Each of the heat sinks has a base, two side walls and a top wall, forming a passage therebetween. The base, side and top walls are all thermally conductive to the corresponding heat producing device, and therefore each of them radiate heat into the passage. Each of the heat sinks also includes several cooling fins that extend into the passage, thereby increasing the thermal efficiency of the heat sink. Furthermore, the passage is of sufficient size to allow multiple heat sinks to have their passages serially lined up, thereby allowing an air mass to flow through each of the heat sinks.

In a second embodiment, one of the heat sinks also includes an air inlet positioned so that it connects an air ingress aperture of the computer with the passage of the heat sink. As a result, air is forced directly from the air ingress aperture to the heat sinks.

In a third embodiment, another one of the heat sinks includes an air outlet positioned so that it connects an air egress aperture of the computer with the passage of the heat sink. As a result, air is forced directly from the heat sinks to the air egress aperture.

A technical advantage achieved with the present invention is that a heat sink and air-duct are combined into a single part, thereby reducing part count and increasing the manufacturability of the computer.

Another technical advantage achieved with the present invention is that the heat sink enables a large and constant velocity of air to flow over multiple CPUs.

Another technical advantage achieved with the present invention is that, by providing more radiant surfaces, the heat sink more efficiently meets the increased power density of modern computer systems.

BRIEF DESCRIPTION OF THE DRAWINGS

FIG. 2 is a front view of one of the heat sinks of FIG. 1.

FIG. 4 is a side view of a second embodiment of the two heat sinks of FIG. 1.

DETAILED DESCRIPTION OF THE PREFERRED EMBODIMENT

The preferred embodiment of the present invention is utilized in a personal computer such as a desktop computer or a tower computer. The personal computer comprises circuit boards, such as a mother board, for mounting and interconnecting various electrical circuits and devices such as one or more central processing units ("CPUs"). It is understood, however, that the present invention is not limited to computers or CPUs, but may be utilized by many different systems and many different heat producing apparatuses.

Figure 1:
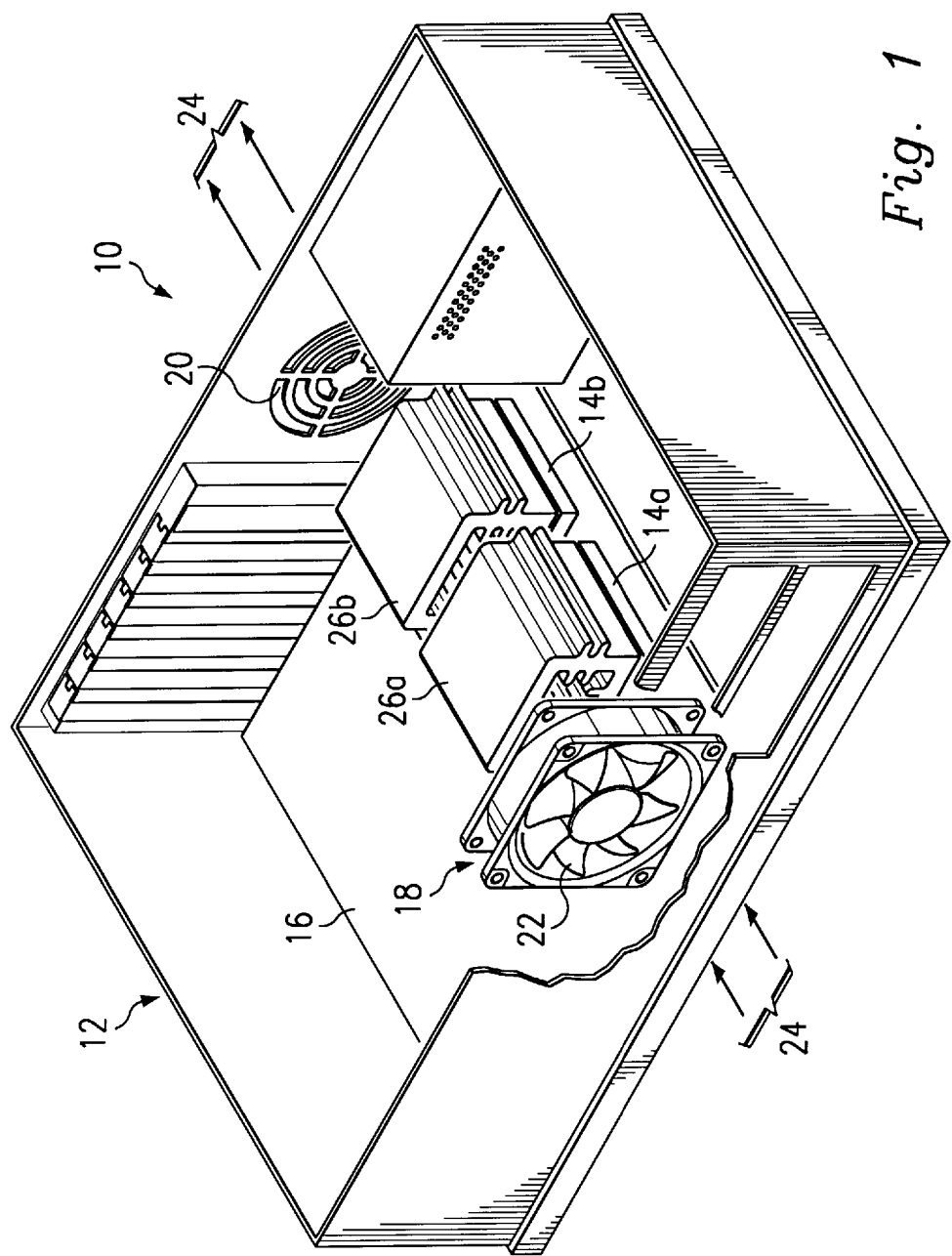
FIG. 1 is a diagram of a computer utilizing two heat sinks of the present invention.

Referring to FIG. 1, reference numeral 10 generally designates a computer utilizing two combination heat sinks and air ducts of the present invention. The computer 10 comprises a chassis 12 for supporting various components inside the computer, including a pair of CPUs 14a, 14b attached to a motherboard 16. Built into the chassis 12 are a plurality of apertures, including an air ingress aperture 18 and an air egress aperture 20. The chassis 12 also includes a cover, which is not shown for the sake of clarity, so that the chassis forms a relatively air-tight chamber, except for the apertures 18, 20. Located inside the air ingress aperture 18 is a fan 22. The fan 22 draws a cooling fluid such as an air mass, represented by arrows 24, in through the ingress aperture 18 and out through the egress aperture 20. Attached to each of the CPUs 14a, 14b, is a combination heat sink and air duct of the present invention, referenced generally as heat sinks 26a and 26b, respectively.

Referring to FIG. 2, the heatsink 26a has a base 32a with a top surface 34a and a bottom surface 36a. The bottom surface 36a extends across and covers the heat generating CPU 14a and is attached thereto using a conventional method such as a clip or thermal epoxy (not shown). The heatsink 26a also includes two side walls 46a, 48a and a top wall 50a that extend about and cover the base 32a to form a passage 52a. Each of the walls 46a, 48a, 50a includes an inner surface 54a, 56a, 58a, respectively, and an outer surface 60a, 62a, 64a, respectively. In the preferred embodiment, the walls 46a, 48a, 50a and the base 32a of the heatsink 26a are formed from a single, extruded, thermally conductive material.

Cooling fins 72a project from the top surface 34a of the base 32a, into the passage 52a. Each of the side walls 46a and 48a also includes cooling fins 74a, 76a and 78a, 80a, respectively. The cooling fins 74a, 78a project into the passage 52a, and the cooling fins 76a, 80a project opposite from the passage. As a result, the heat sink 26a provides a large amount of exposed surface area for heat convection.

Figure 3:
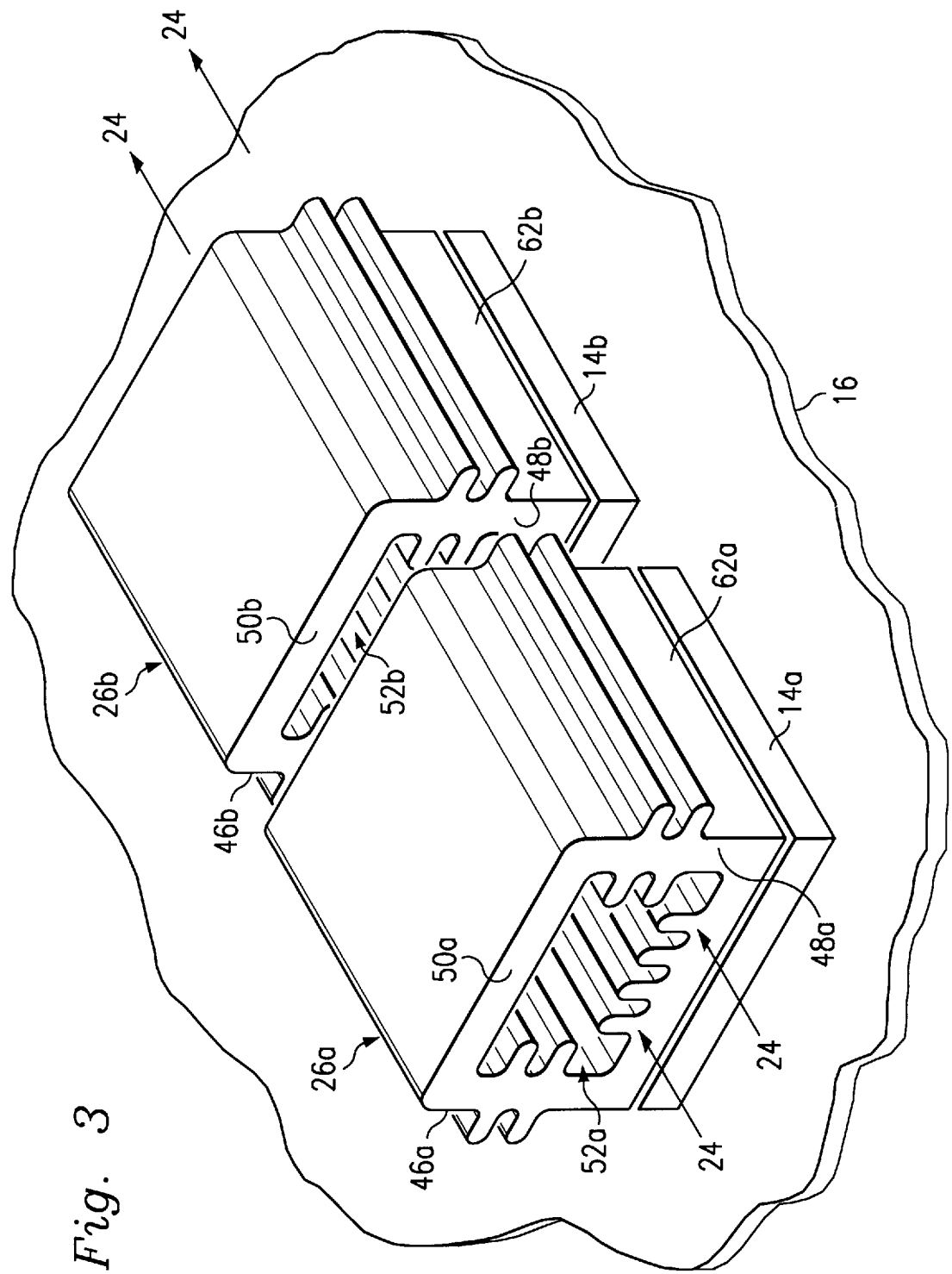
FIG. 3 is a perspective view of a first embodiment of the two heat sinks of FIG. 1.

Referring to FIG. 3, the heat sink 26b provides all of the features described above with reference to heat sink 26a including a base 32b, two side walls 46b, 48b, and a top wall 50b forming a passage 52b. The heat sink 26b is attached to the heat generating CPU 14b, and is positioned so that the passage 52b is co-axially aligned with the passage 52a of the heat sink 26a. As a result of the passages 52a, 52b sharing a common center axis, the air mass 24 serially flows through each passage.

It is essential that the CPUs 14a, 14b be adequately cooled because of the high temperatures at which they operate. Referring to both CPUs and heat sinks generically, i.e., without the suffixes "a" and "b", the heat sink 26 dissipates heat from the CPU 14 as follows. As heat is generated from the CPU 14, it radiates from the bottom surface 36 to the top surface 34 of the base 32. From the top surface 34 the heat then radiates to the cooling fins 72 where it is dissipated into the passage 52. In addition, the heat also radiates through both of the side walls 46, 48 and into the cooling fins 74, 76, 78, 80. The heat that has radiated to the cooling fins 74, 78 dissipates into the passage 52, while the heat that has radiated to the cooling fins 76, 80 dissipates into an environment 82 externally surrounding the heat sink 26. Finally, some heat radiates to the top wall 50 and from there dissipates into the passage 52 as well as the external environment 82.

In the preferred embodiment, the fan 22 (FIG. 1) forces the air mass 24 to flow around and between the cooling fins 72, 74, 78. As a result, the temperature differential between the air mass 24 and the cooling fins 72, 74, 78 causes a majority of the heat to transfer from the heatsink 26 to the air mass, which is then moved out from the computer chassis through the egress aperture 20. In the external environment 82, a second air mass 84 naturally flows between the cooling fins 76, 80 and across the upper surface 64 of the top wall 50. Although not as effective as the air mass 24 moved by the fan 22, the temperature differential between the second air mass 84 and the heat sink 26 causes heat to transfer from the heat sink to the second air mass.

Referring to the heat sinks 26a, 26b separately, the air mass 24 is thereby forced through both passages 52a and 52b. As a result, the heat dissipation provided by both heat sinks 26a, 26b is dramatically improved. Furthermore, because the passages 52a, 52b are completely surrounded by radiant surfaces, the radiant surface area of the heat sinks 26a, 26b is increased over conventional heat sinks, with or without a shroud. Further still, the exterior surfaces of the walls 46a–50a, 46b–50b on each heat sink 26a, 26b, respectively, dissipate additional heat into the second air mass 84 naturally flowing about the external environment 82.

Referring to FIG. 4, in a second embodiment, the heat sinks 26a, 26b are as described above, except the heat sink 26a includes a tapered air inlet 90. The tapered air inlet 90 is shaped to conform both to the passage 52a as well as the air ingress aperture 18. In FIG. 4, the ingress aperture 18 is shown having a greater cross-sectional area than the passage 52a, but other embodiments may be designed with the ingress aperture 18 having a smaller cross-sectional area than the passage 52b. Therefore, the air inlet 90 can take on many different shapes and sizes. Furthermore, the air inlet 90 can be made to direct or change the direction of the air mass 24 from the aperture 18 to the heat sink 26a.

A third embodiment may include a tapered air outlet 91 that is shaped to conform to both the passage 52b as well as the air egress aperture 20. The tapered air outlet 91 works similarly to the tapered air inlet 90 of FIG. 4.

It is understood that the heat sinks 26a, 26b can take many forms and embodiments, the embodiments shown herein are intended to illustrate rather than limit the invention. Therefore, variations may be made without departing from the spirit of the invention. Furthermore, the heat sinks 26a, 26b may be utilized in applications other than computer or electronics applications. Accordingly, it is appropriate that the appended claims be construed broadly and in a manner consistent with the scope of the invention.

What is claimed is:

1. A computer comprising:
   a plurality of heat producing devices;
   a plurality of heat sinks, one for each of the heat producing devices, wherein each of the heat sinks comprises:
      a base having a top surface and bottom surface, wherein the bottom surface is thermally attached to the corresponding devices;
      left and right side walls thermally attached to the base, each having an inner surface and outer surface; and
      a top wall thermally attached to the left and right side walls and having an inner surface and outer surface;
   wherein a single passage is formed by the top surface of the base and the inner surfaces of the left, right and top walls for receiving a fluid and for transferring the fluid to the passage of another one of the heat sinks;
   the top surface of the base and the inner surfaces of the left and right sidewalls each including internal fins extending partially into the single passage;
   the outer surfaces of the left and right sidewalls each including external fins extending opposite the internal fins of the inner surfaces; and
   wherein heat from the corresponding device radiates through the base, the left and right side walls, and the top wall and into the fluid inside the single passage and to the external fins.

2. The computer of claim 1 further comprising:
   a fan for moving the fluid through the passages of the heat sinks.

3. The computer of claim 1 further comprising:
   an air ingress aperture; and
   an air inlet positioned between the air ingress aperture and the passage of one of the heat sinks.

4. The computer of claim 1 further comprising:
   an air egress aperture; and
   an air outlet positioned between the air egress aperture and the passage of one of the heat sinks.

5. The computer of claim 1 wherein the internal and external radiating fins of the sidewalls are colinear.

6. A method for dissipating heat from two contiguous electrical devices, the method comprising the steps of:
   thermally coupling a first and second heat sink to the first and second devices, respectively;
   forming a first single passage inside the first heat sink;
   forming a second single passage inside the second heat sink, the second passage being coaxial with the first passage;
   moving a fluid through the first single passage and then through the second single passage;
   radiating the heat from the first and second devices, into the first and second heat sinks, respectively;
   radiating the heat from the first and second heat sinks, into the first and second single passages, respectively, utilizing internal fins extending partially into the first and second single passages, and external fins extending opposite some of the internal fins; and
   radiating the heat from the first and second passages, into the fluid.

7. The method of claim 6 wherein the steps of forming the first and second passages each include the step of forming the passage with four walls.

8. The method of claim 7 wherein the step of radiating the heat from the first and second heat sinks into the first and second passages, respectively, utilizes radiant fins attached to three of the walls of each heat sink, the radiant fins extending into the first and second passages.

9. The method of claim 6 wherein the internal and the opposite external radiating fins are colinear.

10. A heat sink comprising:
    a base having a top surface and a bottom surface, wherein the bottom surface may be thermally attached to an electrical device;
    left and right side walls thermally attached to the base, each having an inner surface and outer surface; and
    a top wall thermally attached to the left and right side walls and having an inner surface and outer surface;
    wherein a single passage is formed by the top surface of the base and the inner surfaces of the left, right, and top walls for receiving a fluid and for transferring the fluid to another heat sink;
    the top surface of the base and inner surfaces of the left and right sidewalls each including internal fins extending partially into the single passage;
    the outer surfaces of the left and right sidewalls each including external fins extending opposite the internal fins of the inner surface; and
    wherein when the heat sink is attached to the electrical device, heat from the electrical device is capable of radiating through the base, the left and right side walls, and the top wall and into the fluid inside the single passage and to the external fins.

11. The heat sink of claim 10 further comprising an air inlet for connecting the passage to a fluid input source.

12. The heat sink of claim 10 further comprising an air outlet for connecting the passage of a fluid output source.

13. The heat sink of claim 10 wherein the base, side walls and top walls are formed out of a single, extruded piece of heat conducting material.

14. The heat sink of claim 10 wherein the internal and external radiating fins of the sidewalls are colinear.

* * * * *